(12) United States Patent
Kim

(10) Patent No.: US 7,157,357 B2
(45) Date of Patent: Jan. 2, 2007

(54) METHODS OF FORMING HALO REGIONS IN NMOS TRANSISTORS

(75) Inventor: Hak-Dong Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/998,868

(22) Filed: Nov. 29, 2004

(65) Prior Publication Data

US 2005/0142821 A1    Jun. 30, 2005

(30) Foreign Application Priority Data

Dec. 27, 2003   (KR)   ............. 10-2003-0098384

(51) Int. Cl.
   *H01L 21/425*   (2006.01)
(52) U.S. Cl. .............. 438/525; 438/528; 438/923; 257/E21.337
(58) Field of Classification Search ........... 438/302, 438/407, 525, 528, 530, 923; 257/E21.337, 257/21.345
   See application file for complete search history.

(56) References Cited

U.S. PATENT DOCUMENTS 5,466,612 A * 11/1995 Fuse et al. .............. 438/60
5,885,886 A * 3/1999 Lee ......................... 438/528
6,194,278 B1 2/2001 Rengarajan
6,362,054 B1 3/2002 Choi et al.
6,518,136 B1 2/2003 Lee et al.
6,579,751 B1 6/2003 Tran
6,589,847 B1 7/2003 Kadosh et al.
6,853,037 B1 * 2/2005 Kudo et al. ............ 257/369
2004/0150020 A1 * 8/2004 Yamada et al. ......... 257/296
2004/0232516 A1 * 11/2004 Yoneda ................... 257/510
2005/0110098 A1 * 5/2005 Yoshihara ............... 257/371
2005/0151172 A1 * 7/2005 Takemura et al. ...... 257/288

* cited by examiner

*Primary Examiner*—Chandra Chaudhari
(74) *Attorney, Agent, or Firm*—Andrew D. Fortney

(57) ABSTRACT

Disclosed are methods of forming a halo region in n-channel type MOS (NMOS) transistors. In one example, the method includes forming, on a channel region of a semiconductor substrate, a structure having a gate insulation film pattern and a gate conductive film pattern stacked sequentially; forming an ion implantation buffer film on an exposed surface of the semiconductor substrate and the gate conductive film pattern; performing a first ion implantation process for injecting fluorine ions into the semiconductor substrate; performing a second ion implantation process for implanting p-type halo ions into the semiconductor substrate; performing a third ion implantation process for implanting n-type impurity ions into the semiconductor substrate; and diffusing the p-type halo ions and the n-type impurity ions using a thermal process.

18 Claims, 3 Drawing Sheets

METHODS OF FORMING HALO REGIONS IN NMOS TRANSISTORS

TECHNICAL FIELD

The present disclosure relates to semiconductor device manufacturing and, more particularly, to methods of forming halo regions in n-channel metal oxide semiconductor (NMOS) transistors.

BACKGROUND

For implementation of miniature, high performance metal oxide semiconductor (MOS) devices, various techniques are required. These techniques may relate to, for example, the thickness of a gate oxide film, a source/drain region, and a channel region. In particular, examples of these techniques may include a technique for reducing the thickness of a gate oxide film in order to suppress a short channel effect (SCE) generated with the increase of degree of integration of a MOS transistor, a technique for reducing a charge sharing effect by forming a source/drain region using a shallow junction, and a technique for modifying a doping profile in a channel through a retrograde ion implantation or a halo ion implantation in order to suppress a short channel effect.

In the technique for modifying the doping profile, boron (B) ions are used to perform a halo ion implantation in order to suppress the short channel effect. However, it is known that the boron ions exhibit a transient enhanced diffusion phenomenon in that they are diffused in a very sensitive response to thermal budget. Accordingly, it is not easy to attain a desired junction profile using boron doping.

Recently, as an alternative, there has been proposed a method for forming the halo region using ions having a slow diffusion speed. However, this method has a problem in that the halo region does not show its function sufficiently due to a low dopant activation level.

DETAILED DESCRIPTION

Figure 1:
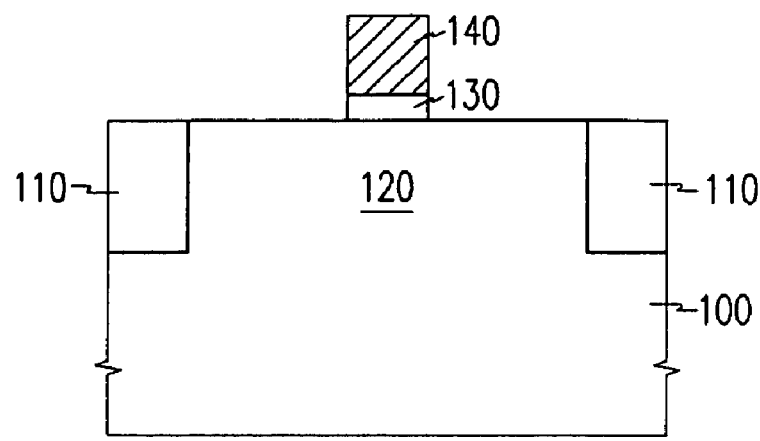
FIGS. 1 to 5 are sectional views illustrating an example disclosed method for forming a halo region in an NMOS transistor.

Referring to FIG. 1, first, a structure having a gate insulation film pattern 130 and a gate conductive film pattern 140 that are stacked sequentially is formed on a channel region of a semiconductor substrate 100. The semiconductor substrate 100 has an active region 120 defined by device isolation fields 1 10. The gate insulation film pattern 130 may be formed by an oxide film pattern and the gate conductive film pattern may be formed by a polysilicon film pattern.

Figure 2:
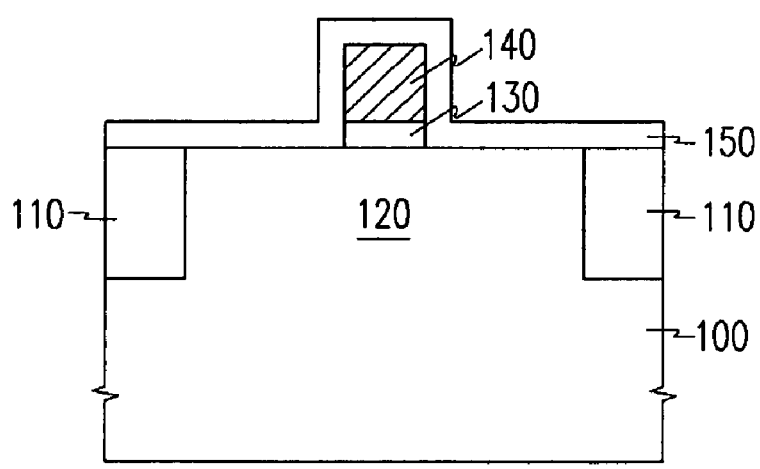

Next, referring to FIG. 2, an ion implantation buffer film 150 is formed on an exposed surface of the semiconductor substrate 100 and the gate conductive film pattern 140. The ion implantation buffer film 150 may be formed by an oxide film.

Figure 3:
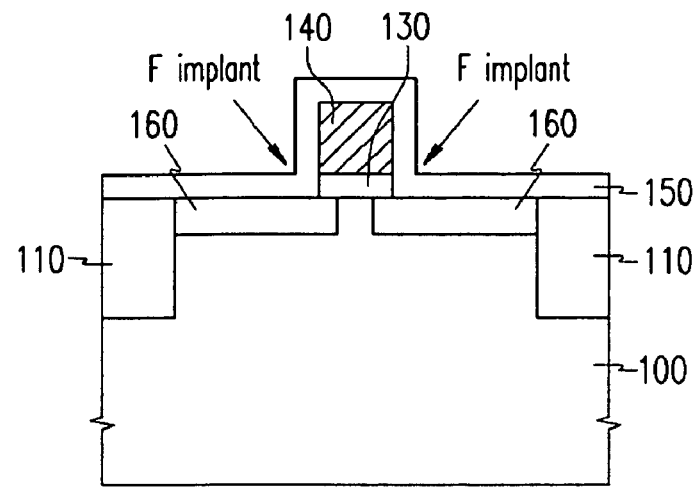

Next, referring FIG. 3, a first ion implantation process for injecting fluorine (F) ions into the semiconductor substrate 100 on which the ion implantation buffer film 150 is formed is performed. This is represented in FIG. 3 by arrows. In the first ion implantation process, the fluorine ions may be implanted with an ion implantation energy in the range of about 5 to 50 kiloelectron-Volts (keV), an ion concentration of about $5\times10^{14}$ to $5\times10^{15}$ ions/cm$^2$, and an implantation gradient of about 20° to 30°. A fluorine (F) ion implantation region 160 is formed in the semiconductor substrate 100 by the first ion implantation process.

Figure 4:
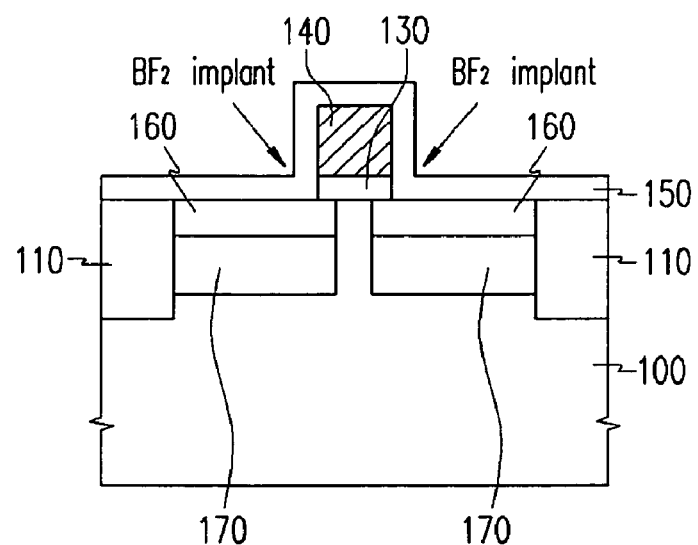

Next, referring to FIG. 4, a second ion implantation process for implanting p-type halo ions into the semiconductor substrate 100 on which the fluorine (F) ion implantation region 160 is formed is performed. The arrows in FIG. 4 represent the implantation process. In the second ion implantation process, BF$_2$ ions are implanted with an ion implantation energy of about 10 to 40 keV, a concentration of about $1\times10^{14}$ to $1\times10^{15}$ ions/cm$^2$, and an implantation gradient of about 20° to 30°. A halo ion implantation region 170 is formed in the semiconductor substrate 100 by the second ion implantation process.

Figure 5:
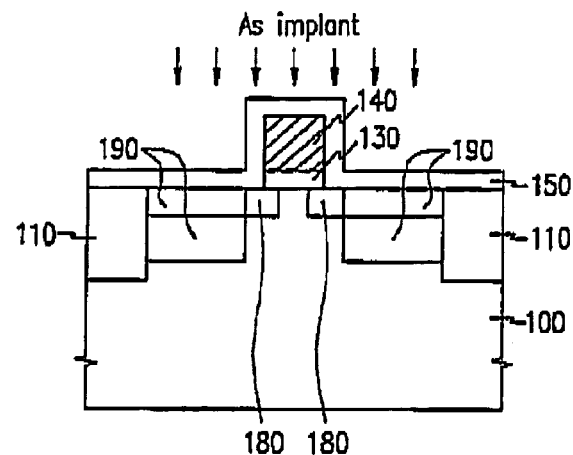

Next, referring to FIG. 5, a third ion implantation process for implanting n-type impurity ions into the semiconductor substrate 100 on which the fluorine ion implantation region 160 and the halo ion implantation region 170 are formed is performed. This implantation is represented by the arrows in FIG. 5. In the third ion implantation process, arsenic (As) ions are implanted with an ion implantation energy of about 5 to 50 keV and a concentration of about $1\times10^{15}$ to $5\times10^{15}$ ions/cm$^2$. Next, a thermal process is performed to diffuse the p-type halo ions and the n-type impurity ions. One example thermal process that may be used is a rapid thermal process (RTP) performed at a temperature of 800 to 1000° C. for 10 to 30 seconds in an atmosphere of N$_2$. After the thermal process, source/drain extension regions 180 are formed and a halo region 190 is formed at a side and a bottom of the source/drain extension regions 180.

Figure 6:
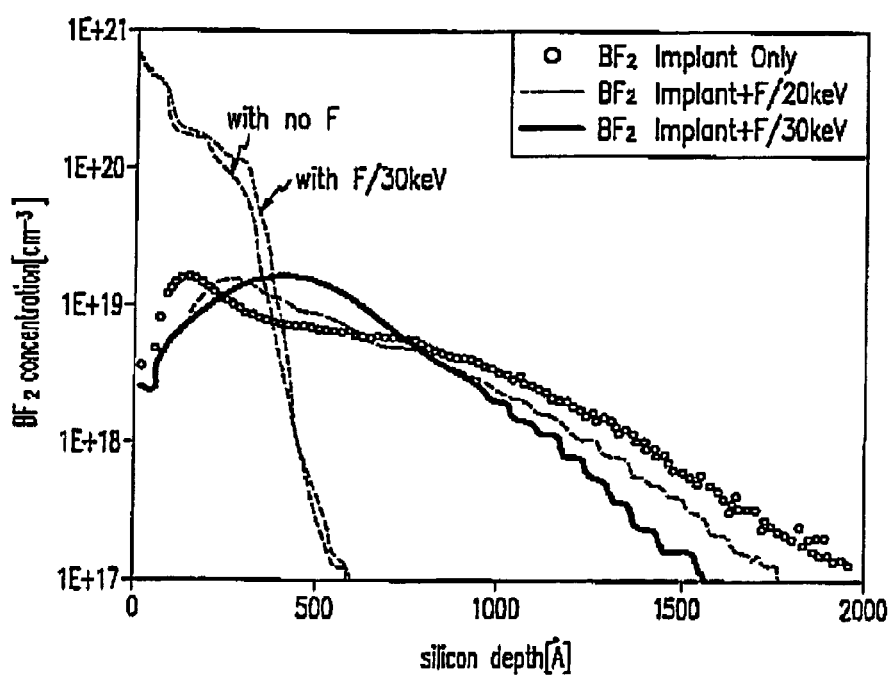
FIG. 6 is a graphical diagram showing concentration distributions of halo impurity ions depending on fluorine implantation energy in accordance with one example disclosed method.

FIG. 6 is a graphical diagram showing concentration distributions of halo impurity ions depending on fluorine implantation energy in a method for forming a halo region in an NMOS transistor in accordance with the disclosed method. From FIG. 6, it can be seen that a case in which the BF$_2$ ions are implanted after the fluorine (F) ions are implanted, as disclosed herein for forming the halo region in the NMOS transistor, has a profile steeper than that of a case where only the BF$_2$ ions are implanted without implanting the fluorine (F) ions, thereby showing improvement of the halo profile. In addition, it can be seen that a concentration profile of the BF$_2$ ions is changed with implantation energy of fluorine (F). This is because a projected range (Rp) into which the fluorine (F) ions are concentrated when the BF$_2$ ions are diffused is determined by the implantation energy of fluorine (F).

As is apparent from the above description, according to methods for forming a halo region in an NMOS transistor, halo ions are concentrated into a projected range (Rp) of fluorine (F) ions by implanting the halo ions after implanting fluorine ions, and then performing a diffusion process using the same thermal process. Accordingly, a junction profile of the halo ions can be easily controlled by adjusting the projected range of the fluorine ions.

As disclosed herein, methods for forming halo regions in NMOS transistors include controlling a profile of boron ions. According to one example, a method for forming a halo region in a NMOS transistor includes forming, on a channel region of a semiconductor substrate, a structure having a gate insulation film pattern and a gate conductive film pattern stacked sequentially. The method may also include forming an ion implantation buffer film on an exposed surface of the semiconductor substrate and the gate conductive film pattern, performing a first ion implantation process for injecting fluorine ions into the semiconductor substrate, performing a second ion implantation process for implanting p-type halo ions into the semiconductor substrate, performing a third ion implantation process for implanting n-type impurity ions into the semiconductor substrate, and diffusing the p-type halo ions and the n-type impurity ions using a thermal process.

According to one particular example, the ion implantation buffer film is formed using an oxide film. Additionally, in the first ion implantation process, the fluorine ions may be implanted with an ion implantation energy of about 5 to 50 keV, a concentration of about $5 \times 10^{14}$ to $5 \times 10^{15}$ ions/cm$^2$, and an implantation gradient of about 20° to 30°.

In one example, in the second ion implantation process, $BF_2$ ions are implanted with an ion implantation energy of about 10 to 40 keV, a concentration of about $1 \times 10^{14}$ to $1 \times 10^{15}$ ions/cm$^2$, and an implantation gradient of about 20° to 30°.

The thermal process may include a rapid thermal process performed at a temperature of 800 to 1000° C. for 10 to 30 seconds in an atmosphere of $N_2$.

This application makes reference to, incorporates the same herein, and claims all benefits accruing under 35 U.S.C. §119 from an application for METHOD FOR FABRICATING THE HALO REGION IN NMOS TRANSISTOR filed in the Korean Industrial Property Office on Dec. 27, 2003, and there duly assigned Serial No. 10-2003-0098384.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for forming a halo region in an NMOS transistor, comprising the steps of:
    forming, on a channel region of a semiconductor substrate, a structure having a gate insulation film pattern and a gate conductive film pattern stacked sequentially;
    forming an ion implantation buffer film comprising an oxide on an exposed surface of the semiconductor substrate and the gate conductive film pattern;
    performing a first ion implantation process for injecting fluorine ions through the ion implantation buffer film into the semiconductor substrate;
    performing a second ion implantation process for implanting p-type halo ions through the ion implantation buffer film into the semiconductor substrate;
    performing a third ion implantation process for implanting n-type impurity ions through the ion implantation buffer film into the semiconductor substrate; and
    diffusing the p-type halo ions and the n-type impurity ions using a thermal process.

2. The method of claim 1, first ion implantation process comprises implanting fluorine ions with an ion implantation energy of 5 to 50 keV a concentration of $5 \times 10^{14}$ to $5 \times 10^{15}$ ions/cm$^2$, and an implantation gradient of 20° to 30°.

3. The method of claim 1, wherein, the second ion implantation process comprises implanting the $BF_2$ ions with an ion implantation energy of 10 to 40 keV, a concentration of $1 \times 10^{14}$ to $1 \times 10^{15}$ ions/cm$^2$, and an implantation gradient of 20° to 30°.

4. The method of claim 1, wherein the thermal process includes a rapid thermal process performed at a temperature of 800 to 1000° for 10 to 30 seconds in an atmosphere of $N_2$.

5. The method of claim 1, wherein said fluorine ions are implanted with an energy of 5 to 50 keV.

6. The method of claim 1, wherein said fluorine ions are implanted at a concentration of $5 \times 10^{14}$ to $5 \times 10^{15}$ ions/cm$^2$.

7. The method of claim 1, wherein said fluorine ions are implanted at a gradient of 20° to 30°.

8. The method of claim 1, wherein said p-type halo ions comprise $BF_2$ ions.

9. The method said p-type halo ions are implanted with an ion implantation energy of 10 to 40 keV.

10. The method of claim 1, wherein said p-type halo ions are implanted at a concentration of $1 \times 10^{14}$ to $1 \times 10^{15}$ ions/cm$^2$.

11. The method of claim 1, wherein said p-type halo ions are implanted at a gradient of 20° to 30°.

12. The method of claim 1, wherein said thermal process is performed at a temperature of 800 to 1000° C.

13. The method of claim 1, wherein said thermal process comprises a rapid thermal process, performed for 10 to 30 seconds.

14. The method of claim 1, wherein said n-type impurity ions comprise As ions.

15. The method of claim 14, wherein said As ions arc implanted with an ion implantation energy of 5 to 50 keV.

16. The method of claim 14, wherein said As ions arc implanted at a concentration of $1 \times 10^{15}$ to $5 \times 10^{15}$ ions/cm$^2$.

17. The method of claim 1, wherein said n-type impurity ions are implanted with an ion implantation energy of 5 to 50 keV.

18. The method of claim 1, wherein said n-type impurity ions are implanted at a concentration of $1 \times 10^{15}$ to $5 \times 10^{15}$ ions/cm$^2$.

* * * * *